(12) United States Patent
Noma

(10) Patent No.: US 7,068,477 B2
(45) Date of Patent: Jun. 27, 2006

(54) MAGNETORESISTIVE FILM WITH NICKEL IRON ALLOY SOFT MAGNETIC LAYER HAVING FACE AND BODY-CENTERED CUBIC LATTICE CRYSTALS

(75) Inventor: Kenji Noma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 297 days.

(21) Appl. No.: 10/299,124

(22) Filed: Nov. 19, 2002

(65) Prior Publication Data

US 2003/0137784 A1    Jul. 24, 2003

(30) Foreign Application Priority Data

Jan. 18, 2002  (JP) .............................. 2002-009560

(51) Int. Cl.
*G11B 5/39*        (2006.01)

(52) U.S. Cl. ............................. 360/324.1; 360/324.12

(58) Field of Classification Search ............ 360/324.1, 360/324.11, 324.12, 324.2, 324, 314
See application file for complete search history.

(56) References Cited

U.S. PATENT DOCUMENTS

| 5,051,856 | A  | * | 9/1991  | Narishige et al. ............ 360/126 |
| 6,120,918 | A  | * | 9/2000  | Osaka et al. ................. 428/900 |
| 6,210,818 | B1 | * | 4/2001  | Saito ..................... 360/324.11 |
| 6,797,415 | B1 | * | 9/2004  | Yamaguchi et al. ......... 360/110 |
| 2002/0191356 | A1 | * | 12/2002 | Hasegawa et al. ..... 360/324.11 |

* cited by examiner

*Primary Examiner*—Craig A. Renner
(74) *Attorney, Agent, or Firm*—Greer, Burns & Crain, Ltd.

(57) ABSTRACT

A soft magnetic layer is made of nickel iron alloy containing crystals of the face-centered cubic lattice and crystals of the body-centered cubic lattice. The face-centered cubic lattice serves to establish a soft magnetic property in the nickel iron alloy. The body-centered cubic lattice contributes to reduction in the electric resistance of the magnetoresistive film as well as to improvement of the magnetoresistive ratio of the magnetoresistive film. Even if the magnetoresistive film is further reduced in size, the magnetoresistive film can sufficiently be prevented from suffering from an increase in the temperature. Even if a sensing current of a larger current value is supplied to the magnetoresistive film, the magnetoresistive film is reliably prevented from deterioration in the characteristics as well as destruction.

5 Claims, 5 Drawing Sheets

MAGNETORESISTIVE FILM WITH NICKEL IRON ALLOY SOFT MAGNETIC LAYER HAVING FACE AND BODY-CENTERED CUBIC LATTICE CRYSTALS

BACKGROUND OF THE INVENTION

1. Field of the Invention

The present invention relates to a magnetoresistive film for use in a read head, for example, of a magnetic recording medium drive or storage device, such as a hard disk drive (HDD) and a magnetic tape drive.

2. Description of the Prior Art

A magnetoresistive film is widely used in a read head incorporated in an HDD, for example. When magnetic data is to be read in the HDD, a sensing current is supplied to the magnetoresistive film. When the magnetoresistive film is exposed to the magnetic field leaking from a recording medium, voltage variation appears in the supplied sensing current. Binary data can be discriminated from each other based on the voltage variation. A larger amplitude of the voltage variation ensures a constant precise determination of magnetic data read out of a recording medium. An increased current value of the sensing current leads to an enlarged amplitude of the voltage variation.

In the field of HDDs, for example, a magnetoresistive film is required to get further reduced in size to achieve an increased recording density. A magnetoresistive film of a reduced size tends to suffer from an excessive increase in the temperature due to its electric resistance. The increased temperature correspondingly induces a further increase in the electric resistance of the magnetoresistive film, resulting in deteriorated characteristics as well as destruction of the magnetoresistive film. An enlarged voltage variation should accordingly be achieved in a magnetoresistive film for use in a read head without suffering from an excessive increase in the temperature.

SUMMARY OF THE INVENTION

Accordingly, it is an object of the present invention to provide a soft magnetic film largely contributing to establishment of a magnetoresistive film of a reduced electric resistance.

According to a first aspect of the present invention, there is provided a magnetoresistive film comprising a soft magnetic layer made of nickel iron alloy containing a crystal of the face-centered cubic lattice and a crystal of the body-centered cubic lattice.

The crystal of the face-centered cubic lattice serves to establish a soft magnetic property in the nickel iron alloy. At the same time, the crystal of the body-centered cubic lattice contributes to reduction in the electric resistance of the magnetoresistive film as well as to improvement of the magnetoresistive (MR) ratio of the magnetoresistive film. Even if the magnetoresistive film is further reduced in size, the magnetoresistive film can sufficiently be prevented from suffering from an increase in the temperature. Even if a sensing current of a larger current value is supplied to the magnetoresistive film, the magnetoresistive film is reliably prevented from deterioration in the characteristics as well as destruction. A sensing current having a larger current value leads to an enlarged variation in the voltage detected out of the magnetoresistive film. Magnetic data can constantly be read out of a magnetic recording medium without any failure or error. The rate of the body-centered cubic lattice may be set smaller than the rate of the face-centered cubic lattice in the soft magnetic layer of the magnetoresistive film. The nickel iron alloy may further contain metallic atoms other than the nickel and iron atoms.

According to a second aspect of the present invention, there is provided a magnetoresistive film comprising a soft magnetic layer made of nickel iron alloy containing iron 0.99 to 1.26 times as much as nickel by weight.

The iron of the predetermined amount causes generation of crystals of the body-centered cubic lattice in the soft magnetic layer of the nickel iron alloy. The body-centered cubic lattice contributes to reduction in the electric resistance of the magnetoresistive film as well as to improvement of the magnetoresistive (MR) ratio of the magnetoresistive film. As described above, even if the magnetoresistive film is further reduced in size, the magnetoresistive film can sufficiently be prevented from suffering from an increase in the temperature. Even if a sensing current of a larger current value is supplied to the magnetoresistive film, the magnetoresistive film is reliably prevented from deterioration in the characteristics as well as destruction. In particular, the nickel iron alloy preferably contains iron 0.99 to 1.26 times as much as nickel by weight. The nickel iron alloy may further contain metallic atoms other than the nickel and iron atoms.

The aforementioned magnetoresistive films may further include a ferromagnetic layer laid over the soft magnetic layer. The soft magnetic layer and the ferromagnetic layer is allowed to serve as a free ferromagnetic layer in the magnetoresistive film. Alternatively, a pinning layer may be laid over the soft magnetic layer. In this case, the magnetoresistive film may further include a pinned ferromagnetic layer laid over the pinning layer, a non-magnetic spacer layer laid over the pinned ferromagnetic layer, and a free ferromagnetic layer laid over the non-magnetic spacer layer. The free ferromagnetic layer may also be made of nickel iron alloy containing a crystal of the face-centered cubic lattice and a crystal of the body-centered cubic lattice in the aforementioned manner. The pinning layer may be an antiferromagnetic layer.

The mentioned magnetoresistive films may be mounted on a head slider which is incorporated in a magnetic recording medium drive or storage device, such as a hard disk drive (HDD). Otherwise, the aforementioned soft magnetic film as well as the combination of the soft magnetic film and a ferromagnetic layer may be used for any purposes other than a magnetoresistive film.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
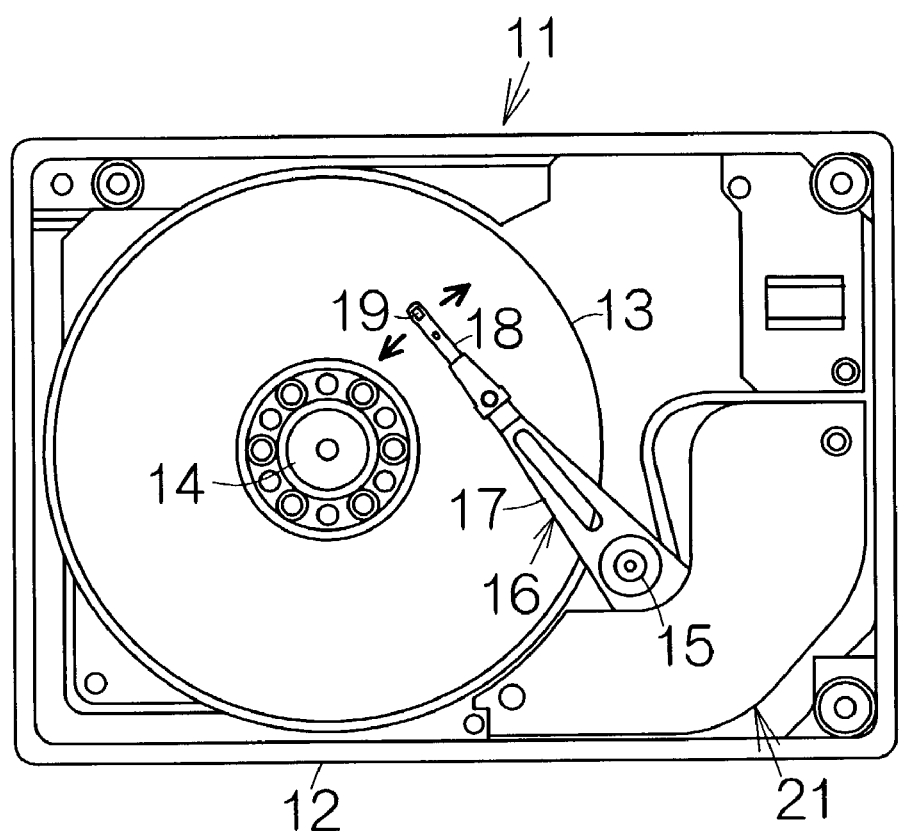
FIG. 1 is a plan view schematically illustrating an interior structure of a hard disk drive (HDD)

FIG. 1 schematically shows an interior structure of a hard disk drive (HDD) 11 as a specific example of a magnetic recording medium drive or storage device. The HDD 11 includes a box-shaped primary enclosure 12 which defines an inner space of a flat parallelepiped, for example. At least one magnetic recording disk 13 is accommodated as a recording medium in the inner space. The magnetic recording disk 13 is mounted on the driving shaft of a spindle motor 14. The spindle motor 14 can drive the magnetic recording disk 13 so as to rotate at a high revolution rate such as 7,200 rpm or 10,000 rpm, for example. A cover, not shown, is coupled to the primary enclosure 12 so as to define the closed inner space.

A carriage 16 is also accommodated in the inner space of the primary enclosure 12. The carriage 16 is designed to swing around a vertical support shaft 15. The carriage 16 has a rigid swing arm 17 extending horizontally from the support shaft 15, and an elastic head suspension 18 fixed to the tip end of the swinging arm 17. The elastic head suspension 18 extends forward from the swinging arm 17. As conventionally known, a flying head slider 19 is cantilevered at the tip end of the elastic head suspension 18 by a gimbal spring, not shown. The elastic head suspension 18 urges the flying head slider 19 toward the surface of the magnetic recording disk 13. When the magnetic recording disk 13 rotates, airflow is generated along the surface of the magnetic recording disk 13. The air flow serves to generate a lift on the flying head slider 19. The lift is balanced with the urging force from the elastic head suspension 18. The flying head slider 19 is thus allowed to keep flying with a relatively high stability when the magnetic recording disk 13 rotates.

When the carriage 16 is driven to swing around the support shaft 15 during flight of the flying head slider 19, the flying head slider 19 is allowed to cross the surface of the magnetic recording disk 13 in the radial direction. The radial movement brings the flying head slider 19 above a target recording track on the magnetic recording disk 13. In this case, an electromagnetic actuator 21, such as a voice coil motor (VCM), may be employed to achieve the swinging movement of the carriage 16. In the case where two or more magnetic recording disks 13 are incorporated into the inner space of the primary enclosure 12, a pair of elastic head suspensions 18, namely, the flying head sliders 19 are disposed between the adjacent magnetic recording disks 13, as conventionally known.

Figure 2:
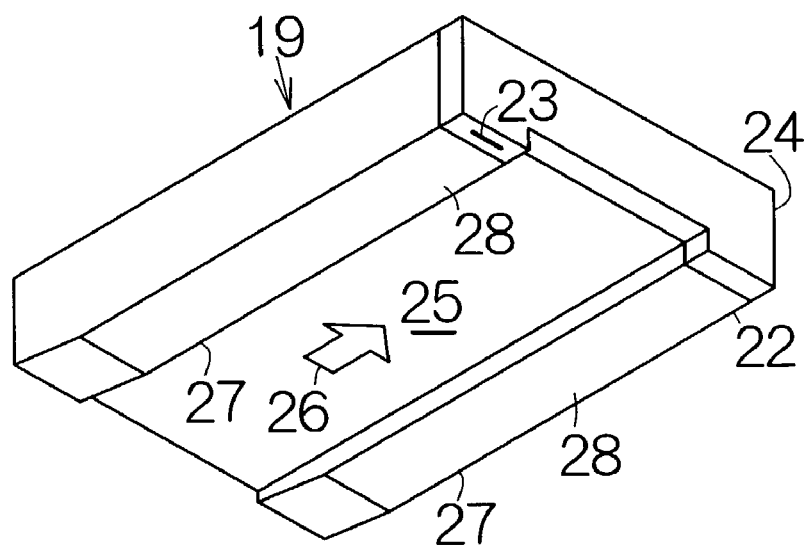
FIG. 2 is an enlarged perspective view showing a specific embodiment of a flying head slider.

FIG. 2 shows a specific example of the flying head slider 19. The flying head slider 19 includes a slider body 22 made of $Al_2O_3$—TiC in the form of a flat parallelepiped. A head protection layer 24 made of $Al_2O_3$ is coupled to the outflow or trailing end of the slider body 22. The head protection layer 24 has a read/write electromagnetic transducer 23. A medium-opposed surface or bottom surface 25 is defined over the slider body 22 and the head protection layer 24 so as to face the magnetic recording disk 13. The bottom surface 25 receives an airflow 26 caused by the rotation of the magnetic recording disk 13.

A pair of rails 27 is formed on the bottom surface 25, extending from the inflow or leading end to the trailing or downstream end. Each rail 27 has an air bearing surface (ABS) 28 on its top surface, where the aforementioned lift is generated by the airflow 26. The leading end of the read/write electromagnetic transducer 23, which is embedded in the head protection layer 24, is exposed out of the ABS 28, as described later in detail. The exposed end of the read/write electromagnetic transducer 23 may be covered with a diamond-like carbon (DLC) protection film covering over the ABS 28. The flying head slider 19 may take any shape other than the above-described one.

Figure 3:
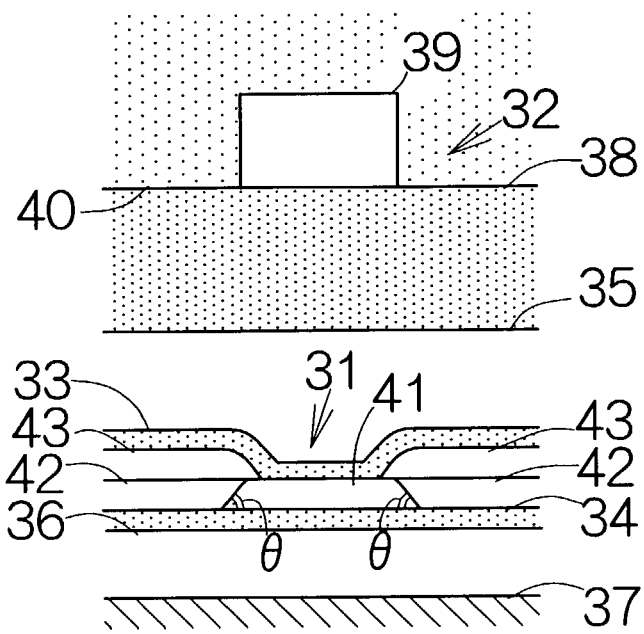
FIG. 3 is a front view schematically showing a read/write electromagnetic transducer.

FIG. 3 shows the bottom surface 25 in detail. The read/write electromagnetic transducer 23 is formed as a composite thin film magnetic head. Specifically, the read/write electromagnetic transducer 23 includes a magnetoresistive (MR) read element 31 and an inductive write element or a thin film magnetic head 32. As conventionally known, the MR read element 31 can detect bit data by utilizing variation in the electric resistance caused by the magnetic field acting from the magnetic recording disk 13. The inductive write element 32 can write bit data into the magnetic recording disk 13 by utilizing a magnetic field induced by an electrically-conductive coil pattern, not shown, for example.

The MR read element 31 is interposed between a pair of upper and lower non-magnetic gap layers 33, 34. The non-magnetic gap layers 33, 34 may be made of $Al_2O_3$, for example. The non-magnetic gap layers 33, 34 interposing the MR read element 31 are together interposed between upper and lower shield layers 35, 36. The upper and lower shield layers 35, 36 may be made of FeN or NiFe, for example. The lower shield layer 36 extends over the surface of an $Al_2O_3$ (alumina) film 37. The alumina film 37 functions as an undercoat film or the lower half of the aforementioned head protection layer 24.

The inductive write element 32 includes a non-magnetic gap layer 38 extending over the surface of the upper shield layer 35. The non-magnetic gap layer 38 may be made of $Al_2O_3$, for example. The upper shield layer 35 is opposed to an upper magnetic pole layer 39. The non-magnetic gap layer 38 intervenes between the upper shield layer 35 and the upper magnetic pole layer 39. The upper magnetic pole layer 39 may be made of NiFe, for example. The upper magnetic pole layer 39 is covered with an $Al_2O_3$ (alumina) film 40 spreading over the surface of the non-magnetic gap layer 38. The alumina film 40 serves to hold the MR read element 31 and the inductive write element 32 against the aforementioned alumina film 37. The alumina film 40 functions as an overcoat or the upper half of the head protection layer 24.

The upper magnetic pole layer 39 and the upper shield layer 35 together constitute the magnetic core of the inductive write element 32. Specifically, the upper shield layer 35 of the MR read element 31 serves as the lower magnetic pole layer of the inductive write element 32. When a magnetic field is induced at an electrically-conductive coil pattern, magnetic flux is caused to circulate through the upper magnetic pole layer 39 and the upper shield layer 35. The non-magnetic gap layer 38 serves to leak the circulated magnetic flux from the bottom surface 25. The leaked magnetic flux forms a magnetic field for recordation. It should be noted that the upper shield layer 35 of the MR read element 31 may be formed independent of the lower magnetic pole layer of the inductive write element 32.

Figure 4:
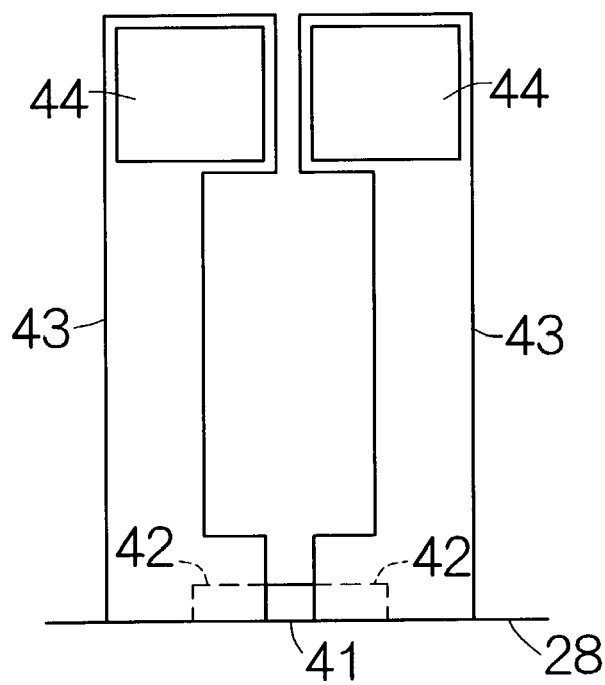
FIG. 4 is an enlarged plan view showing a magnetoresistive (MR) read element.

Referring also to FIG. 4, the MR read element 31 includes a magnetoresistive (MR) film or a spin valve film 41 laid over the surface of a non-magnetic gap layer 34. The spin valve film 41 is designed to extend along the ABS 28. The spin valve film 41 has a pair of end surfaces extending along planes intersecting the surface of the non-magnetic gap layer 34 at an inclined angle θ.

Likewise, a pair of domain control stripe layers 42 are formed over the non-magnetic gap layer 34, extending along the ABS 28. The domain control stripe layers 42 interpose the spin valve film 41 over the non-magnetic gap layer 34 along the ABS 28. The tip ends of the domain control stripe layers 42 contact the corresponding end surfaces of the spin valve film 41. The domain control stripe layer 42 may be made of a hard magnetic metallic material such as CoPt, CoCrPt, or the like.

Lead layers 43 are laid over the surface of the respective domain control stripe layers 42. The lead layers 43 are interposed between the domain control stripe layers 42 and the upper shield layer 35. The front ends of the respective lead layers 43 contact the respective end surfaces of the spin valve films 41 via the domain control stripe layers 42. A sensing current is supplied through the lead layers 43 to the spin valve film 41. The lead layer 43 may be made of material, such as Cu, which has a high electric conductivity.

As is obvious from FIG. 4, the respective lead layers 43 are designed to extend rearward over the surface of the non-magnetic gap layer 34 from the front ends exposed at the ABS 28. Terminal pads 44 are individually connected to the rear ends of the respective lead layers 43. The terminal pads 44 may extend over the surface of the lead layers 43. The terminal pads 44 are connected to terminal pads, not shown, on the elastic head suspension 18 through Au balls, not shown, for example, when the flying head slider 19 is fixed to the elastic head suspension 18.

Figure 5:
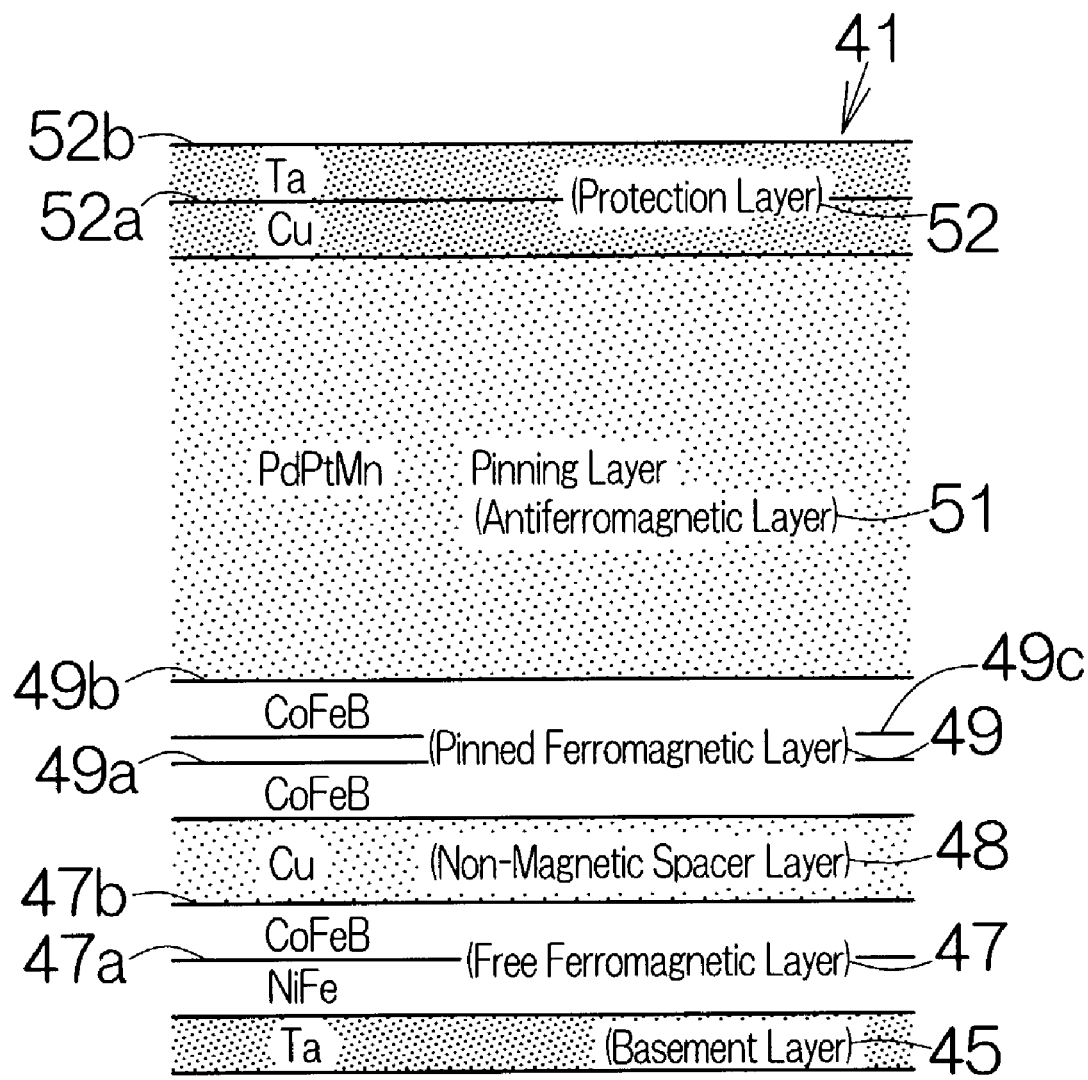
FIG. 5 is an enlarged front view schematically showing the structure of a spin valve film according to a first embodiment of the present invention.

FIG. 5 shows the spin valve film 41 according to a first embodiment of the present invention. The spin valve film 41 has a layered structure including a basement layer 45 laid over the surface of the non-magnetic gap layer 34. The basement layer 45 may be made of a Ta layer, for example.

A free ferromagnetic layer 47 is laid over the surface of the basement layer 45. The free ferromagnetic layer 47 includes a NiFe layer 47a laid over the surface of the basement layer 45, and a CoFeB ferromagnetic layer 47b laid over the surface of the NiFe layer 47a. The NiFe layer 47a contains crystals of the face-centered cubic lattice (fcc) and crystals of the body-centered cubic lattice (bcc). The rate of the crystals of the body-centered cubic lattice is set smaller than the rate of the crystals of the face-centered cubic lattice in the NiFe layer 47a. Unless the rate of the crystals of the body-centered cubic lattice exceeds the rate of the crystals of the face-centered cubic lattice, the NiFe 47a is allowed to enjoy a soft magnetic property. The NiFe layer 47a may have a thickness equal to or larger than 160 nm approximately. The CoFeB ferromagnetic layer 47b has a soft magnetic property.

A non-magnetic spacer layer 48 is laid over the free ferromagnetic layer 47. The non-magnetic spacer layer 48 may be made of an electrically-conductive metallic material such as Cu. A pinned ferromagnetic layer 49 is laid over the non-magnetic spacer layer 48. The pinned ferromagnetic layer 49 may have a multilayered structure, for example, including a pair of CoFeB layers 49a, 49b. The CoFeB layers 49a, 49b may interpose a coupling layer 49c such as a Ru layer. The pinned ferromagnetic layer 49 has a soft magnetic property. It should be noted that the pinned ferromagnetic layer 49 may be made of other materials.

A pinning layer 51 is laid over the surface of the pinned ferromagnetic layer 49. The pinning layer 51 may be made of an antiferromagnetic material, such as PdPtMn, FeMn, or the like. Alternatively, the pinning layer 51 may be made of any hard magnetic material. The pinning layer 51 serves to fix the magnetization of the pinned ferromagnetic layer 49 in a predetermined direction. A protection layer 52 may be laid over the surface of the pinning layer 51. The protection layer 52 may include a Cu layer 52a and a cap layer or a Ta layer 52b formed over the Cu layer 52a.

When the MR read element 31 is opposed to the surface of the magnetic recording disk 13, the magnetization of the free ferromagnetic layer 47 is caused to rotate in the spin valve film 41 depending on the polarity of the magnetic field acting from the magnetic recording disk 13, as conventionally known. The rotating magnetization of the free ferromagnetic layer 47 causes the electric resistance of the spin valve film 41 to vary significantly. When a sensing current is supplied to the spin valve film 41 through the lead layers 43, the level of the electric signal detected from the lead layers 43 varies in response to the variation in the electric resistance. The variation of the level is utilized to determine bit data.

The aforementioned NiFe layer 47a serves to reduce the electric resistance of the spin valve film 41. Even if the spin valve film 41 is further reduced in size, the spin valve film 41 can sufficiently be prevented from suffering from an increase in the temperature. Even if a sensing current of a larger current value is supplied to the spin valve film 41, the spin valve film 41 is reliably prevented from deterioration in the characteristics as well as destruction. A sensing current having a larger current value leads to an enlarged variation in the voltage detected out of the terminal pads 44. Magnetic data can constantly be read out of the magnetic recording disk 13 without any failure or error.

The inventor has verified the characteristics of the spin valve film 41. The inventor has sequentially formed a Ta layer, a NiFe layer 47a, a CoFeB layer 47b, a Cu layer, a CoFeB layer, a Ru layer, a CoFeB layer, a PdPtMn layer, a Cu layer and a Ta layer, each having a predetermined thickness, over a wafer in the vacuum atmosphere. Sputtering was employed to form the layers. When the NiFe layer 47a is deposited, the alloy mass of $Ni_{50}Fe_{50}$ (wt %) was used as the target of the sputtering. The ratio by weight was actually set at 1:1.08 approximately between the nickel and the iron in the resulting NiFe layer 47a. The NiFe layer 47a of $Ni_{48}Fe_{52}$ was obtained. After the layers were deposited, the PdPtMn layer was subjected to a heat treatment so that the PdPtMn layer got regularized. A specific example of the spin valve film 41 was formed in this manner. The inventor measured the electric resistance or a so-called sheet resistance ρ/t[Ω], the magnetoresistive (MR) ratio [%], the magnetic coupling field (of the pinning performance) Hua [kA/m], and the magnetic coupling field Hin[A/m], of the resulting spin valve film 41.

The inventor also prepared a spin valve film of a comparative example. The comparative example was formed in the manner described above, except that the alloy mass of $Ni_{77}Fe_{23}$ (wt %) was employed as the target of the sputtering when the NiFe layer was deposited. The ratio by weight was actually set at 3:1 approximately between the nickel and the iron in the resulting NiFe layer. The NiFe layer of $Ni_{75}Fe_{25}$ was obtained. The inventor likewise measured the sheet resistance ρ/t[Ω], the magnetoresistive (MR) ratio [%], the magnetic coupling field (of the pinning performance) Hua [kA/m], and the magnetic coupling field Hin[A/m], of the resulting spin valve film of the comparative example.

TABLE 1

|  | Fe/Ni by weight | ρ/t [Ω] | MR Ratio [%] | Hua [kA/m] | Hin [A/m] |
|---|---|---|---|---|---|
| Invention | 1.08 | 10.6 | 12.2 | 101.5 | 238.7 |
| Compared Example | 0.33 | 11.8 | 8.4 | 82.6 | 517.3 |

As is obvious from Table 1, the electric resistance ρ/t was reduced in the spin valve film 41 of the embodiment as compared with the spin valve film of the comparative example. Moreover, the spin valve film 41 of the embodiment enjoyed a superior MR ratio as compared with the spin valve film of the comparative example. Similarly, a good magnetic coupling field Hua was observed in the spin valve film 41 of the embodiment as compared with the spin valve film of the comparative example. It has been confirmed that a sufficient magnetic coupling was established between the antiferromagnetic layer and the pinned ferromagnetic layer. The magnetic coupling field Hin was largely reduced.

It should be noted that metallic atoms such as Ir, Ru, Cr, or the like, may be added to the NiFe layer 47a at a rate smaller than 50 at % in the aforementioned spin valve film 41. Reduction in the electric resistance ρ/t and improvement of the MR ratio have been observed in the spin valve film 41 of the embodiment in spite of the addition of these metallic atoms.

Figure 6:
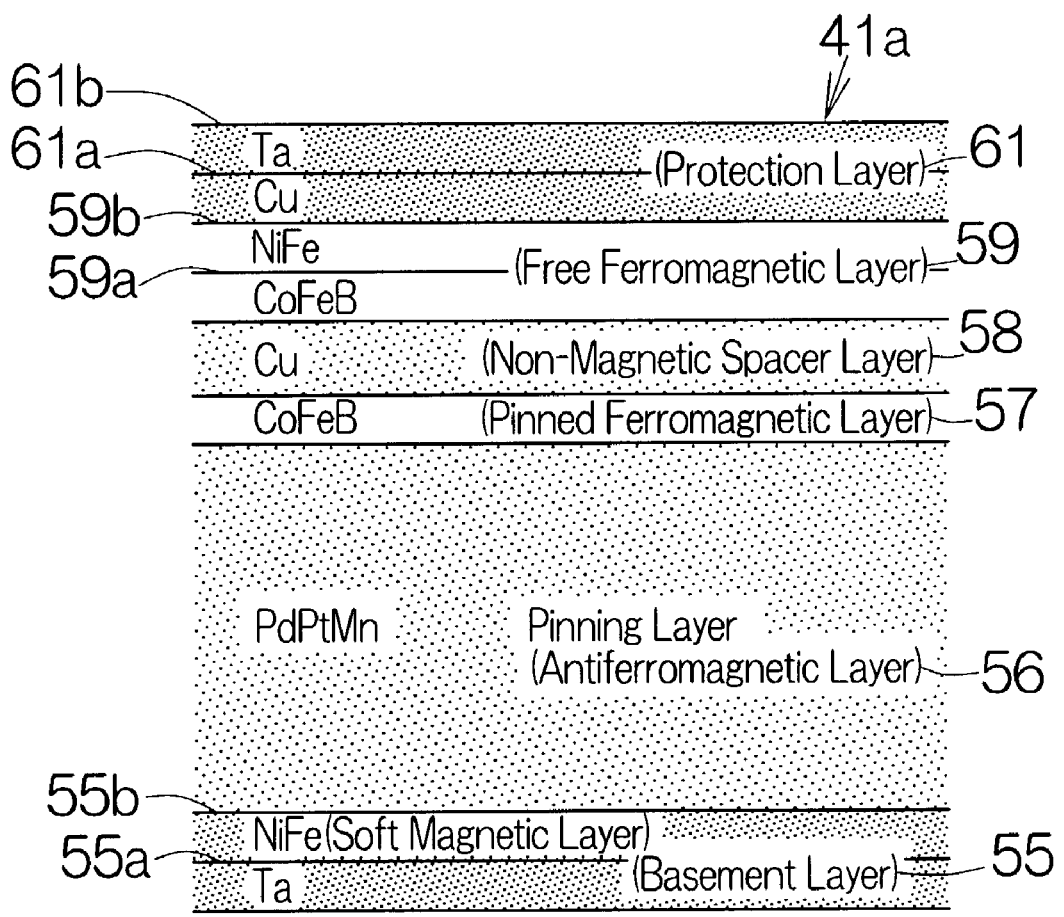
FIG. 6 is an enlarged front view schematically showing the structure of a spin valve film according to a second embodiment of the present invention.

FIG. 6 shows the spin valve film 41a according to a second embodiment of the present invention. The spin valve film 41a has a layered structure including a free ferromagnetic layer below a pinned ferromagnetic layer. Specifically, the spin valve film 41a has a basement layer 55 laid over the surface of the non-magnetic gap layer 34. The basement layer 55 may include a Ta layer 55a and a nickel iron alloy layer (NiFe layer) 55b laid over the Ta layer 55b. The NiFe layer 55b contains crystals of the face-centered cubic lattice and crystals of the body-centered cubic lattice. The rate of the body-centered cubic lattice is set smaller than the rate of the face-centered cubic lattice in the NiFe layer 55b. Unless the rate of the body-centered cubic lattice exceeds the rate of the face-centered cubic lattice, the NiFe 55b is allowed to enjoy a soft magnetic property. The NiFe layer 55b may have a thickness equal to or larger than 160 nm approximately.

A pinning layer 56 is laid over the surface of the basement layer 55. The pinning layer 56 may be made of an antiferromagnetic material such as PdPtMn, FeMn, for example. Alternatively, the pinning layer 56 may be made of any hard magnetic material. A pinned ferromagnetic layer 57 is laid over the surface of the pinning layer 56. The pinned ferromagnetic layer 57 may be made of a ferromagnetic material, such as CoFeB, for example. The pinning layer 56 serves to fix the magnetization of the pinned ferromagnetic layer 57 in a predetermined direction.

A non-magnetic spacer layer 58 is laid over the surface of the pinned ferromagnetic layer 57. The non-magnetic spacer layer 58 may be made of an electrically-conductive metallic material such as Cu, for example. A free ferromagnetic layer 59 is laid over the surface of the non-magnetic spacer layer 58. The free ferromagnetic layer 59 may include a CoFeB layer 59a laid over the surface of the non-magnetic spacer layer 58 and a NiFe layer 59b laid over the CoFeB layer 59a. The NiFe layer 59b may contain crystals of the face-centered cubic lattice and crystals of the body-centered cubic lattice in the same manner as described above. The surface of the free ferromagnetic layer 59 may be covered with a protection layer 61. The protection layer 61 may include a Cu layer 61a and a cap layer or a Ta layer 61b laid over the Cu layer 61a.

The inventor has verified the characteristics of the spin valve film 41a. The inventor has sequentially formed a Ta layer, a NiFe layer 55b, a PdPtMn layer, a CoFeB layer, a Cu layer, a CoFeB layer, a NiFe layer, a Cu layer and a Ta layer, each having a predetermined thickness, over a wafer in the vacuum atmosphere. Sputtering was employed to form the layers. After the layers were deposited, the PdPtMn layer was subjected to a heat treatment so that the PdPtMn layer got regularized. The inventor measured the sheet resistance ρ/t[Ω] as well as the magnetoresistive (MR) ratio [%], of the resulting spin valve film 41a. In particular, the inventor has prepared some examples of the spin valve film 41a. The ratio of iron to nickel by weight was differently set in the individual examples.

Figure 7:
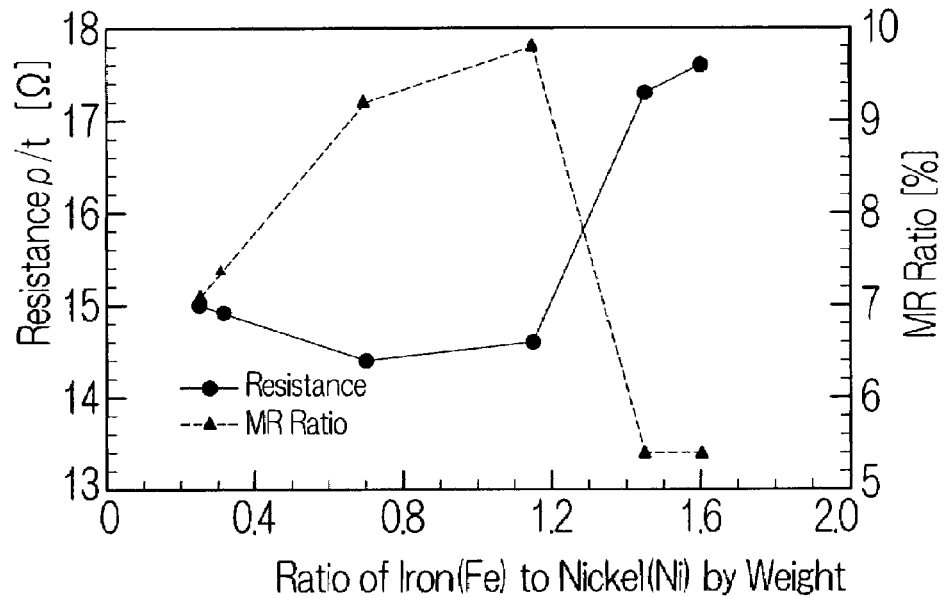
FIG. 7 is a graph showing the correlation between the ratio of iron to nickel by weight and the resistance as well as the MR ratio.
Figure 8:
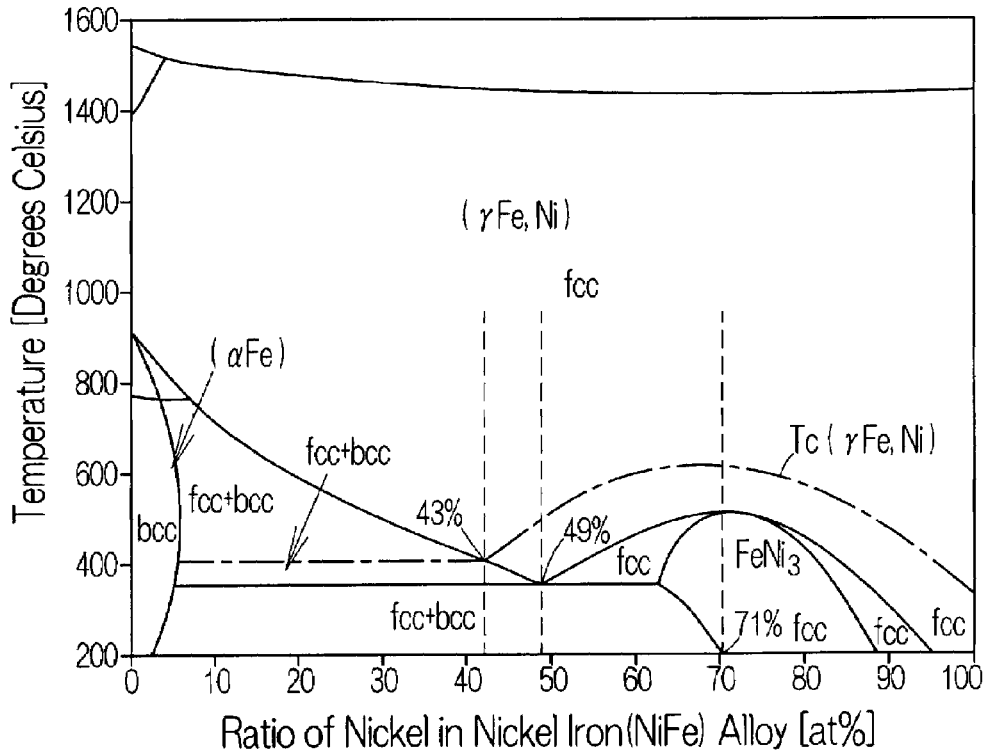
FIG. 8 is a phase diagram for nickel iron alloy.

As is obvious from FIG. 7, the electric resistance ρ/t was reduced in the spin valve film 41a if the NiFe layer 55b contains the iron approximately 0.3 to 1.15 times as much as the nickel by weight. Moreover, improvement of the MR ratio was also observed in the spin valve film 41a. The inventor also has reviewed the result of FIG. 7 referring also to the phase diagram of the nickel iron alloy. The inventor has found that the reduction in the electric resistance as well as the improvement of the MR ratio depends upon the ratio of the body-centered cubic lattice within the nickel iron alloy. As is apparent from FIG. 8, crystals of the body-centered cubic lattice start to appear in the nickel iron alloy when the rate of the iron atoms exceeds 29 at %, equivalent to 0.39 wt % for the ratio of the iron to the nickel by weight. An increased weight in the nickel iron alloy leads to an increased amount of the body-centered cubic lattice. Based on the Curie temperature Tc of the (γFe, Ni), when the rate of the iron atoms exceeds 57 at %, equivalent to 1.26 wt % for the ratio of the iron to the nickel by weight, the body-centered cubic lattice gets dominant over the face-centered cubic lattice of FeNi$_3$. In this condition, the Curie temperature Tc remains constant irrespective of the further increased ratio of the iron by weight. Based on the comparison between FIGS. 7 and 8, the rate of the iron atoms ranging between 29 at % and 57 at % (between 0.39 wt % and 1.26 wt %) is expected to achieve reduction in the electric resistance as well as improvement of the MR ratio in the spin valve film 41, 41a. In particular, the rate of the iron atoms ranging between 51 at % and 57 at % (between 0.99 wt % and 1.26 wt %) is expected to achieve reduction in the electric resistance as well as improvement of the MR ratio in the spin valve film 41, 41a.

What is claimed is:

1. A magnetoresistive film comprising:
    a soft magnetic layer made of nickel iron alloy containing a crystal of face-centered cubic lattice and a crystal of body-centered cubic lattice;
    a pinning layer laid over the soft magnetic layer;
    a pinned ferromagnetic layer laid over the pinning layer;
    a non-magnetic spacer layer laid over the pinned ferromagnetic layer; and
    a free ferromagnetic layer laid over the non-magnetic spacer layer.

2. The magnetoresistive film according to claim 1, wherein rate of the body-centered cubic lattice is set smaller than rate of the face-centered cubic lattice in the soft magnetic layer.

3. The magnetoresistive film according to claim 1, wherein the pinning layer comprises an antiferromagnetic layer.

4. The magnetoresistive film according to claim 1, wherein
the free ferromagnetic layer is made of nickel iron alloy containing a crystal of face-centered cubic lattice and a crystal of body-centered cubic lattice.

5. The magnetoresistive film according to claim 1, wherein the nickel iron alloy contains a metallic atom other than nickel and iron atoms.

* * * * *